(12) United States Patent
Byeon et al.

(10) Patent No.: US 12,707,858 B2
(45) Date of Patent: Aug. 11, 2026

(54) DISPLAY DEVICE

(71) Applicant: Samsung Display Co., Ltd., Yongin-si (KR)

(72) Inventors: Minseong Byeon, Yongin-si (KR); Sang-Il Park, Yongin-si (KR); Sungguk An, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 372 days.

(21) Appl. No.: 18/451,682

(22) Filed: Aug. 17, 2023

(65) Prior Publication Data

US 2024/0099100 A1 Mar. 21, 2024

(30) Foreign Application Priority Data

Sep. 19, 2022 (KR) ........................ 10-2022-0118132
Jun. 20, 2023 (KR) ........................ 10-2023-0078890

(51) Int. Cl.
*H10K 59/80* (2023.01)
*B32B 7/022* (2019.01)
*B32B 7/12* (2006.01)
*B32B 17/10* (2006.01)
(Continued)

(52) U.S. Cl.
CPC ............. *H10K 59/87* (2023.02); *B32B 7/022* (2019.01); *B32B 7/12* (2013.01); *B32B 17/10* (2013.01); *B32B 27/08* (2013.01); *B32B 27/36* (2013.01); *B32B 2255/10* (2013.01); *B32B 2307/536* (2013.01); *B32B 2307/54* (2013.01);
(Continued)

(58) Field of Classification Search
CPC ........... B32B 7/022; B32B 7/12; B32B 17/10; B32B 27/08; B32B 27/36; B32B 2255/10; B32B 2307/536; B32B 2307/54; B32B 2307/546; B32B 2307/7376; B32B 2307/748; B32B 2457/20; H10K 59/40;
(Continued)

(56) References Cited

U.S. PATENT DOCUMENTS 10,632,711 B2 4/2020 Lee et al.
2018/0354227 A1 12/2018 Park et al.
(Continued)

FOREIGN PATENT DOCUMENTS

KR 10-2018-0055973 A 5/2018
KR 10-2040299 B1 11/2019
(Continued)

OTHER PUBLICATIONS

Kim et al., Display device, Aug. 25, 2021, machine translation of KR 20210104514 A, pp. 1-17 (Year: 2021).*
(Continued)

*Primary Examiner* — Natalia A Gondarenko
(74) *Attorney, Agent, or Firm* — Womble Bond Dickinson (US) LLP

(57) ABSTRACT

A display device includes a display module, a window on the display module, and a protective layer on the window, and including a first base layer, a second base layer on the first base layer, a base adhesive layer between the first base layer and the second base layer, and including a silicone-based adhesive, and a surface coating layer on the second base layer, having a single-film structure, and including a hard coating material and an anti-fingerprint material.

19 Claims, 9 Drawing Sheets

(51) Int. Cl.
*B32B 27/08* (2006.01)
*B32B 27/36* (2006.01)

(52) U.S. Cl.
CPC . *B32B 2307/546* (2013.01); *B32B 2307/7376* (2023.05); *B32B 2307/748* (2013.01); *B32B 2457/20* (2013.01)

(58) Field of Classification Search
CPC ............ H10K 2102/311; H10K 77/111; H10K 59/87; H10K 59/8791
USPC .................................................... 257/680, 72
See application file for complete search history.

(56) References Cited

U.S. PATENT DOCUMENTS

| | | | | |
|---|---|---|---|---|
| 2019/0346592 | A1* | 11/2019 | Nakazawa | G02B 1/14 |
| 2020/0333522 | A1* | 10/2020 | Kang | G06F 1/1652 |
| 2021/0268786 | A1 | 9/2021 | Kim et al. | |
| 2021/0408411 | A1* | 12/2021 | Wang | H10K 71/80 |
| 2025/0001740 | A1* | 1/2025 | Cho | B32B 7/12 |

FOREIGN PATENT DOCUMENTS

| | | | | | |
|---|---|---|---|---|---|
| KR | 10-2021-0104514 | A | | 8/2021 | |
| KR | 20210104514 | A | * | 8/2021 | G06F 1/1641 |
| KR | 10-2021-0109952 | A | | 9/2021 | |
| KR | 10-2398049 | B1 | | 5/2022 | |
| WO | WO-2021066187 | A1 | * | 4/2021 | B32B 27/36 |

OTHER PUBLICATIONS

Yano et al., Display device and substrate layered body, Apr. 8, 2021, machine translation of WO 2021066187 A1, pp. 1-30 (Year: 2021).*

* cited by examiner

DISPLAY DEVICE

CROSS-REFERENCE TO RELATED APPLICATIONS

This application claims priority to and the benefit of Korean Patent Application No. 10-2022-0118132, filed on Sep. 19, 2022, and Korean Patent Application No. 10-2023-0078890, filed on Jun. 20, 2023, the entire contents of which are hereby incorporated by reference.

FIELD

Aspects of the present disclosure relate to a display device.

BACKGROUND

Various display devices used for multimedia devices such as televisions, mobile phones, tablet computers, or game consoles have been developed. A display device may include various functional layers to provide a user with a color image having excellent quality.

Recently, to achieve various types of display devices such as a display device including a curved surface, a rollable display device, or a foldable display device, research on thin display devices is in progress. A thin display device may be achieved by reducing the number of functional layers and utilizing a functional layer having various functions.

In making a display device become thinner, it is also important to ensure the impact resistance of the display device. Accordingly, research on a structure of a display device having excellent impact resistance and optical characteristics is in progress.

The above information disclosed in this Background section is only for enhancement of understanding of the background of the invention and therefore it may contain information that does not form the prior art that is already known to a person of ordinary skill in the art.

SUMMARY

Aspects of embodiments of the present disclosure are directed to a display device with improved impact resistance and visibility.

According to some embodiments of the present disclosure, there is provided a display device including: a display module; a window on the display module; and a protective layer on the window, and including: a first base layer, a second base layer on the first base layer, a base adhesive layer between the first base layer and the second base layer, and including a silicone-based adhesive, and a surface coating layer on the second base layer, having a single-film structure, and including a hard coating material and an anti-fingerprint material.

In some embodiments, the base adhesive layer has a tensile modulus of about 0.1 GPa to about 4.5 GPa.

In some embodiments, the base adhesive layer has a thickness of about 3 μm to about 4.5 μm.

In some embodiments, an edge part of the base adhesive layer is more inward than each of an edge part of the first base layer and an edge part of the second base layer.

In some embodiments, the edge part of the base adhesive layer is more inward than the edge part of the first base layer by a first width, more inward than the edge part of the second base layer by a second width, and each of the first width and the second width is about 450 μm to about 600 μm.

In some embodiments, when viewed from a plan view, the base adhesive layer has a smaller area than each of the first base layer and the second base layer.

In some embodiments, the first base layer and the second base layer each have a modulus of about 3.5 GPa to about 5.0 GPa.

In some embodiments, each of the first base layer and the second base layer has a thickness of about 35 μm to about 50 μm.

In some embodiments, the first base layer includes polyethylene terephthalate.

In some embodiments, the second base layer is composed of a material different from that of the first base layer.

In some embodiments, the protective layer further includes an adhesive layer between the first base layer and the window, and the adhesive layer has a thickness of about 25 μm to about 70 μm.

In some embodiments, the protective layer, the window, and the display module are folded and unfolded with respect to a folding axis.

In some embodiments, the window includes a thin-film glass.

In some embodiments, the window has a thickness of about 80 μm or less.

In some embodiments, the surface coating layer has a thickness of about 3 μm to about 10 μm.

In some embodiments, the surface coating layer has a surface contact angle of about 110° to about 120°.

In some embodiments, each of the first base layer and the second base layer is an elongated film with a controlled optical axis, and each of a difference between tensile moduli of the first base layer and the second base layer on a first elongation axis and a difference between tensile moduli of the first base layer and the second base layer on a second elongation axis is 0 to about 1.1 GPa.

In some embodiments, the surface coating layer has a Vickers hardness number of about 40 or more.

In some embodiments, the surface coating layer includes the anti-fingerprint material in an amount of 0 wt % to about 10 wt % with respect to a total weight of the surface coating layer.

In some embodiments, the display device further includes a hard coating layer on at least one surface among upper and lower surfaces of the first base layer, and upper and lower surfaces of the second base layer.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

To facilitate a fuller understanding of the present invention, reference is now made to the accompanying drawings, in which like elements are referenced with like numerals. These drawings should not be construed as limiting the present invention, but are intended to be illustrative only.

Hereinafter, a display device according to some embodiments will be described with reference to the drawings.

Figure 1:
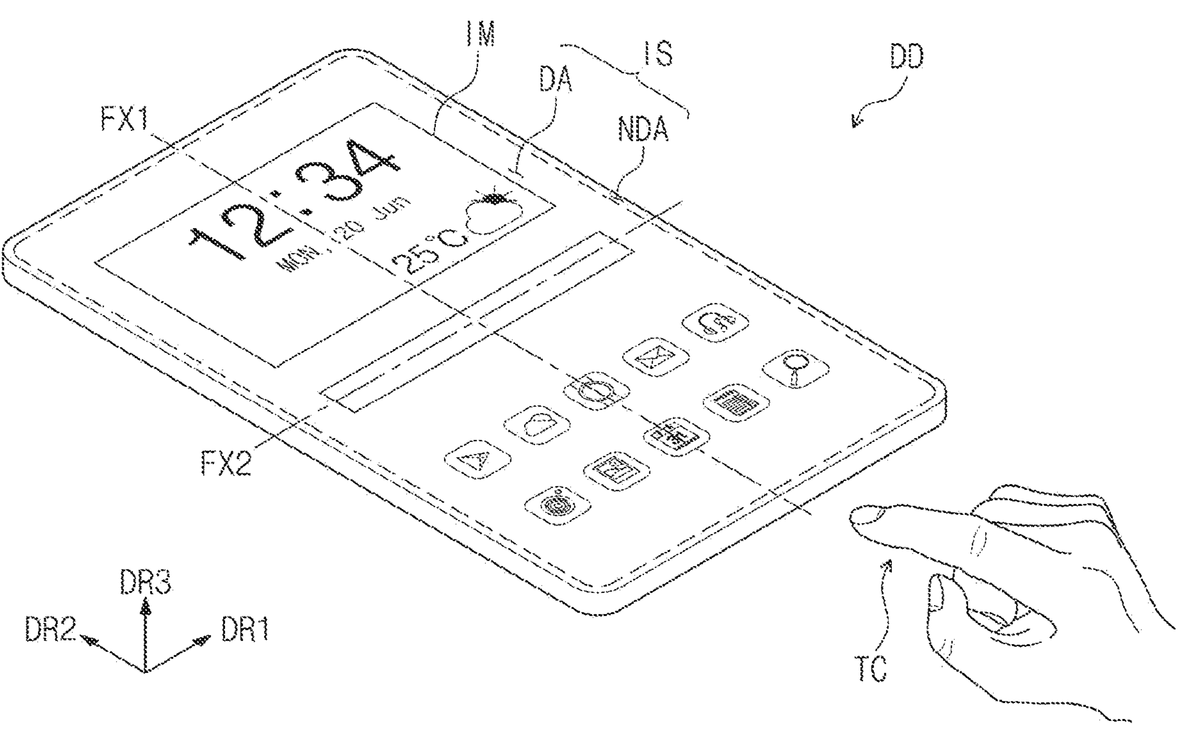
FIG. 1 is a perspective view of a display device according to some embodiments of the present disclosure.

FIG. 1 is a perspective view of a display device according to some embodiments of the present disclosure.

Referring to FIG. 1, a display device DD may have a rectangular shape having short sides parallel to a first direction DR1, and long sides parallel to a second direction DR2 crossing the first direction DR1. However, a shape of the display device DD is not limited thereto, and the display device DD may be provided in various shapes. For example, the display device DD may have a rectangular shape having long sides parallel to the first direction DR1, and short sides parallel to the second direction DR2, or may have a square shape in which a side parallel to the first direction DR1 and a side parallel to the second direction DR2 have the same length.

The display device DD may be a foldable electronic device. The display device DD according to some embodiments of the present disclosure may be folded with respect to a folding axis FX1 or FX2 extending in predetermined directions. Hereinafter, a state in which the display device DD is folded with respect to the folding axis FX1 or FX2 is defined as a folded state, and a state in which the display device DD is not folded with respect to the folding axis FX1 or FX2 is defined as a non-folded state. The folding axes FX1 and FX2 are rotational axes, which are virtual lines occurring when the display device DD is folded. For example, the folding axes FX1 and FX2 may be formed by a structure included in the display device DD.

The folding axes FX1 and FX2 may extend in the first direction DR1 or the second direction DR2. In some embodiments, a folding axis extending in the second direction DR2 is defined as a first folding axis FX1, and a folding axis extending in the first direction DR1 is defined as a second folding axis FX2. The display device DD may be folded with respect to at least any one folding axis of the first and second folding axes FX1 and FX2.

The display device DD according to some embodiments may not only be a large-sized display device such as a television and a monitor, but also a small- and medium-sized display device such as a mobile phone, a tablet computer, a car navigation system, and a game console. This is merely an example, and the display device DD according to some embodiments may be used in another electronic apparatus not departing from the concept of the present disclosure.

As illustrated in FIG. 1, the display device DD may display an image IM, toward a third direction DR3, on a display surface IS parallel to each of the first direction DR1 and the second direction DR2. The display surface IS on which the image IM is displayed may correspond to the front surface of the display device DD.

The display surface IS of the display device DD may be divided into a plurality of regions. A display region DA and a non-display region NDA may be defined on the display surface IS of the display device DD. The display region DA may be a region displaying the image IM, and a user views the image IM through the display region DA. The display region DA may be a quadrilateral shape. The non-display region NDA may surround the display region DA. Accordingly, a shape of the display region DA may be substantially defined by the non-display region NDA. However, this is illustrated as an example, and the non-display region NDA may be disposed adjacent to one side of the display region DA, and may be omitted.

The non-display region NDA is a region which is adjacent to the display region DA, and does not display the image IM. A bezel region of the display device DD may be defined by at least the non-display region NDA.

The display device DD according to the present disclosure may sense a user's input TC applied from the outside. The user's input TC may include various types of external input such as from a part of a user's body, light, heat, or pressure. In FIG. 1, it is illustrated that the user's input TC is a touch from a user's hand applied to a front surface of the display device DD. However, this is illustrated as an example, and, as described above, the user's input TC may be supplied in various forms. In some examples, the display device DD may sense, according to the structure thereof, the user's input TC applied to a side surface or a rear surface of the display device DD; however, embodiments of the present disclosure are not limited thereto.

The display device DD may activate the display surface IS to display the image IM and to simultaneously sense the user's input TC. In FIG. 1, it is illustrated that a region sensing the user's input TC is provided in the display region DA that can display the image IM. However, this is illustrated as an example, and the region sensing the user's input TC is provided in the non-display region NDA, or in the entire region of the display surface IS.

Figure 2A:
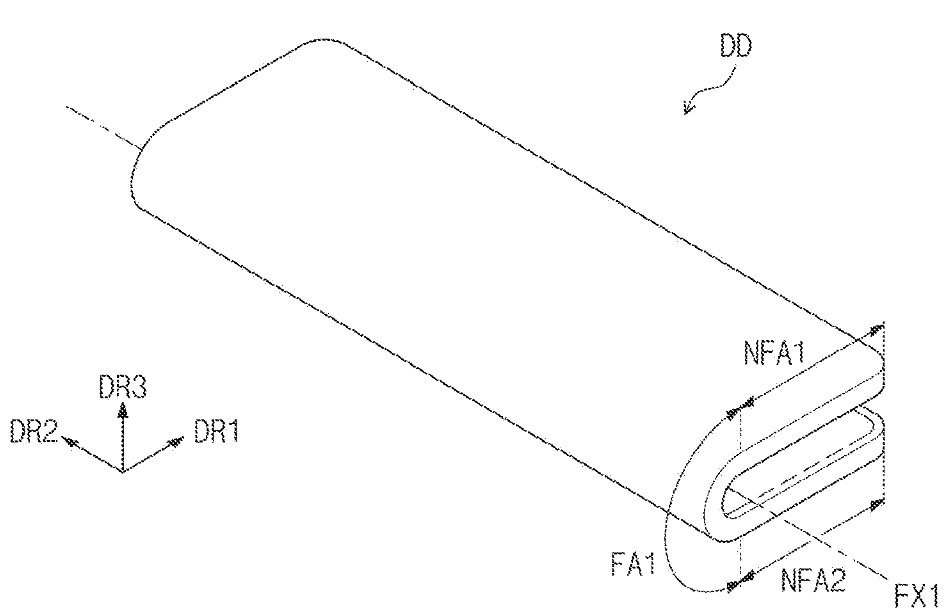
FIG. 2A is a diagram illustrating a state in which the display device illustrated in FIG. 1 is in-folded along a first folding axis.
Figure 2B:
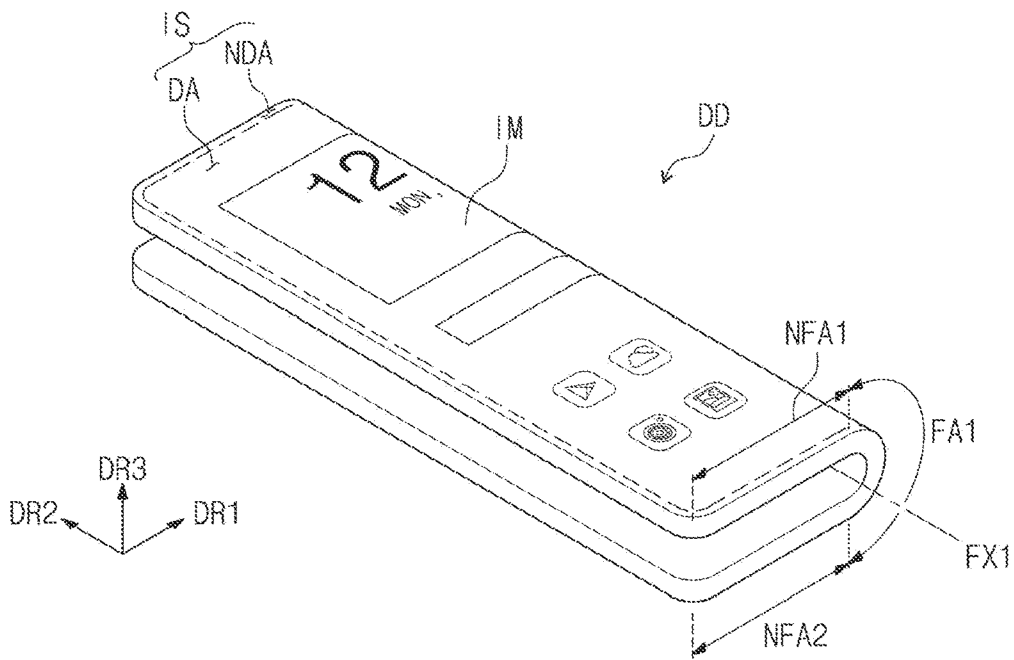
FIG. 2B is a diagram illustrating a state in which the display device illustrated in FIG. 1 is out-folded along a first folding axis.

FIG. 2A is a diagram illustrating a state in which a display device DD illustrated in FIG. 1 is in-folded along (e.g., folded with respect to) the first folding axis FX1, and FIG. 2B is a diagram illustrating a state in which the display device DD illustrated in FIG. 1 is out-folded along (e.g., folded with respect to) the first folding axis FX1.

Referring to FIGS. 1 and 2A, the display device DD may be a foldable display device. The display device DD may be folded with respect to a folding axis extending in a set or predetermined direction (for example, extending along the first folding axis FX1, or the second folding axis FX2). FIG. 2A exemplarily illustrates the display device DD folded with respect to the first folding axis FX1 extending in the second direction DR2.

A plurality of regions may be defined in the display device DD according to an operation form. The plurality of regions may be divided into a folding region FA1 and one or more non-folding regions NFA1 and NFA2. The folding region FA1 is defined between two non-folding regions NFA1 and NFA2.

The folding region FA1 is a region folded with respect to the first folding axis FX1, and which is curved (e.g., substantially forms a curvature). Here, the first folding axis FX1 may extend along the second direction DR2, that is, a long axis direction of the display device DD. The folding region FA1 is folded along (e.g., folded with respect to) the first folding axis FX1, and is defined as a region extending in the second direction DR2.

In some embodiments, the non-folding regions NFA1 and NFA2 may include a first non-folding region NFA1 and a second non-folding region NFA2. The first non-folding region NFA1 is adjacent to one side of the folding region FA1 in the first direction DR1, and the second non-folding region NFA2 is adjacent to the other side of the folding region FA1 in the first direction DR1.

The display device DD may be in-folded or out-folded. "In-folding" may refer to folding the display device DD such that folded portions of the front surface of the display surface IS face inward and toward each other, and "out-folding" refers to folding the display device DD such that the folded portions of the rear surface of the display device DD face inward and each other while the folded portions of the front surface of the display device IS face outward and away from each other. Folding the display device DD such that the display surfaces of the non-folding regions NFA1 and NFA2 face each other is defined as "in-folding", and folding the display device DD such that the display surfaces of the non-folding regions NFA1 and NFA2 face outwards is defined as "out-folding".

The display device DD illustrated in FIG. 2A may be in-folded so that the display surface IS of the first non-folding region NFA1 and the display surface IS of the second non-folding region NFA2 face each other. The first non-folding region NFA1 may move along a generally clockwise path (e.g., rotate clockwise) with respect to the first folding axis FX1, and thus, the display device DD may be in-folded. In order for the display device DD to be in-folded such that the first non-folding region NFA1 and the second non-folding region NFA2 are aligned (e.g., completely overlap when viewed from a plan view and extend in parallel along the first and second directions DR1 and DR2), the first folding axis FX1 may be defined at the center of the display device DD in the first direction DR1.

Referring to FIG. 2B, the display device DD may be out-folded with respect to the first folding axis FX1. When the display surface IS of the first non-folding region NFA1 and the display surface IS of the second non-folding region NFA2 are exposed to the outside, the display device DD may display the image IM. In addition, the display surface IS of the folding region FA1 exposed to the outside may also display the image IM. As illustrated in FIG. 1, the display device DD may display the image IM in an unfolded state. The first non-folding region NFA1, the second non-folding region NFA2, and the folding region FA1 may display images supplying independent information, or display parts of one image supplying one piece of information.

The display device DD may be manufactured to be capable of having both an in-folded state and an out-folded state, or to have any one of an in-folded state or an out-folded state.

In FIGS. 2A and 2B, one folding region FA1 is defined in the display device DD; however, embodiments of the of the present disclosure are not limited thereto. For example, a plurality of folding regions may be defined in the display device DD according to some embodiments.

Figure 3A:
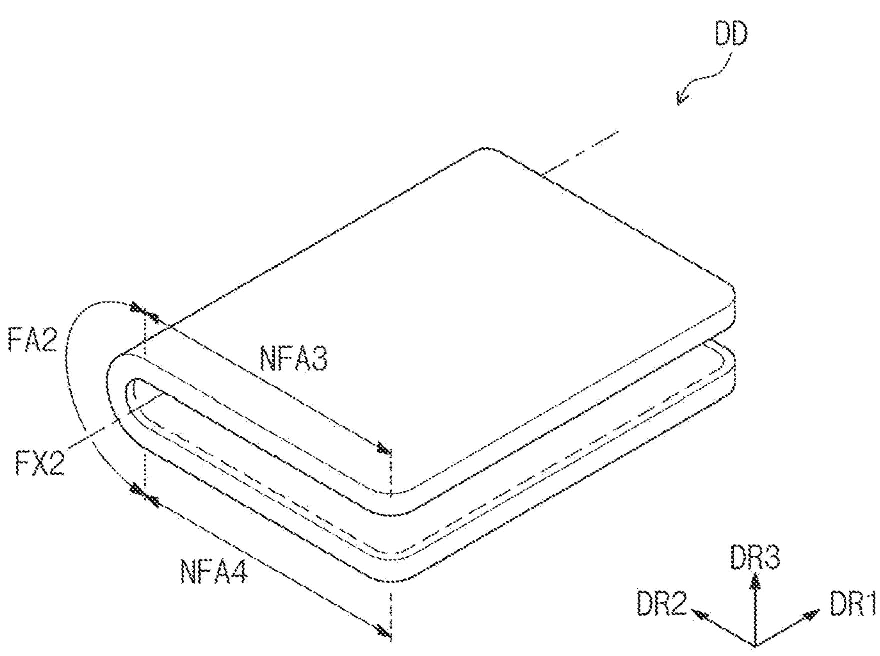
FIG. 3A is a diagram illustrating a state in which the display device illustrated in FIG. 1 is in-folded along a second folding axis.
Figure 3B:
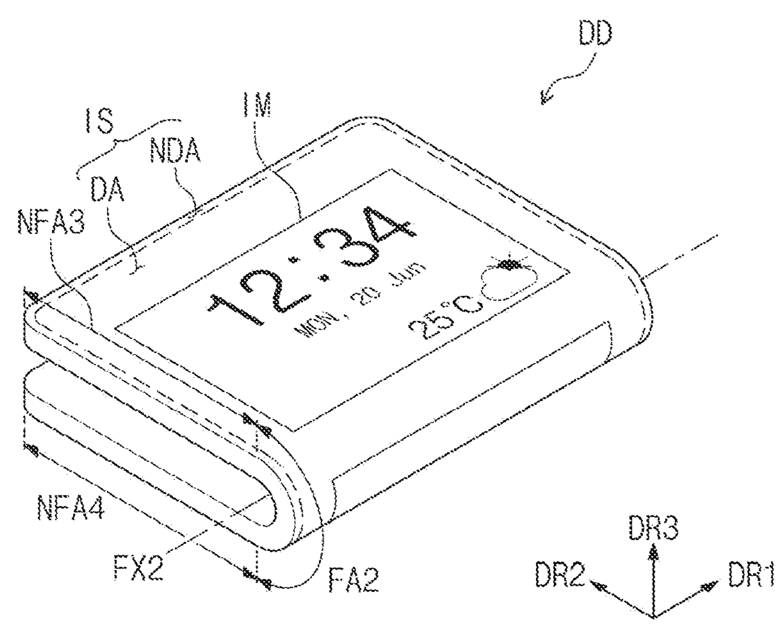
FIG. 3B is a diagram illustrating a state in which the display device illustrated in FIG. 1 is out-folded along a second folding axis.

FIG. 3A is a diagram illustrating a state in which the display device illustrated in FIG. 1 is in-folded along (e.g., is in-folded with respect to) a second folding axis, and FIG. 3B is a diagram illustrating a state in which the display device illustrated in FIG. 1 is out-folded along (e.g., is out-folded with respect to) the second folding axis.

Referring to FIGS. 3A and 3B, the display device DD may be in-folded or out-folded with respect to a second folding axis FX2. The second folding axis FX2 may extend along the first direction DR1, that is, a short axis direction of the display device DD.

A plurality of regions may be defined in the display device DD according to an operation form. The plurality of regions may be divided into a folding region FA2 and one or more non-folding regions NFA3 and NFA4. The folding region FA2 is defined between two non-folding regions NFA3 and NFA4.

The folding region FA2 is a region folded with respect to the second folding axis FX2, and which is curved (e.g., substantially forms a curvature). The folding region FA2 is folded along (e.g., folded with respect to) the second folding axis FX2, and is defined as a region extending primarily in the first direction DR1.

In some embodiments, the non-folding regions NFA3 and NFA4 may include a third non-folding region NFA3 and a fourth non-folding region NFA4. The third non-folding region NFA3 may be adjacent to one side of the folding region FA2 in the second direction DR2, and the fourth non-folding region NFA4 may be adjacent to the other side of the folding region FA2 in the second direction DR2.

FIGS. 3A and 3B illustrate that a single folding region FA2 is defined in the display device DD; however, embodiments of the present disclosure are not limited thereto. For example, a plurality of folding regions may be defined in the display device DD according to some embodiments.

Figure 4:
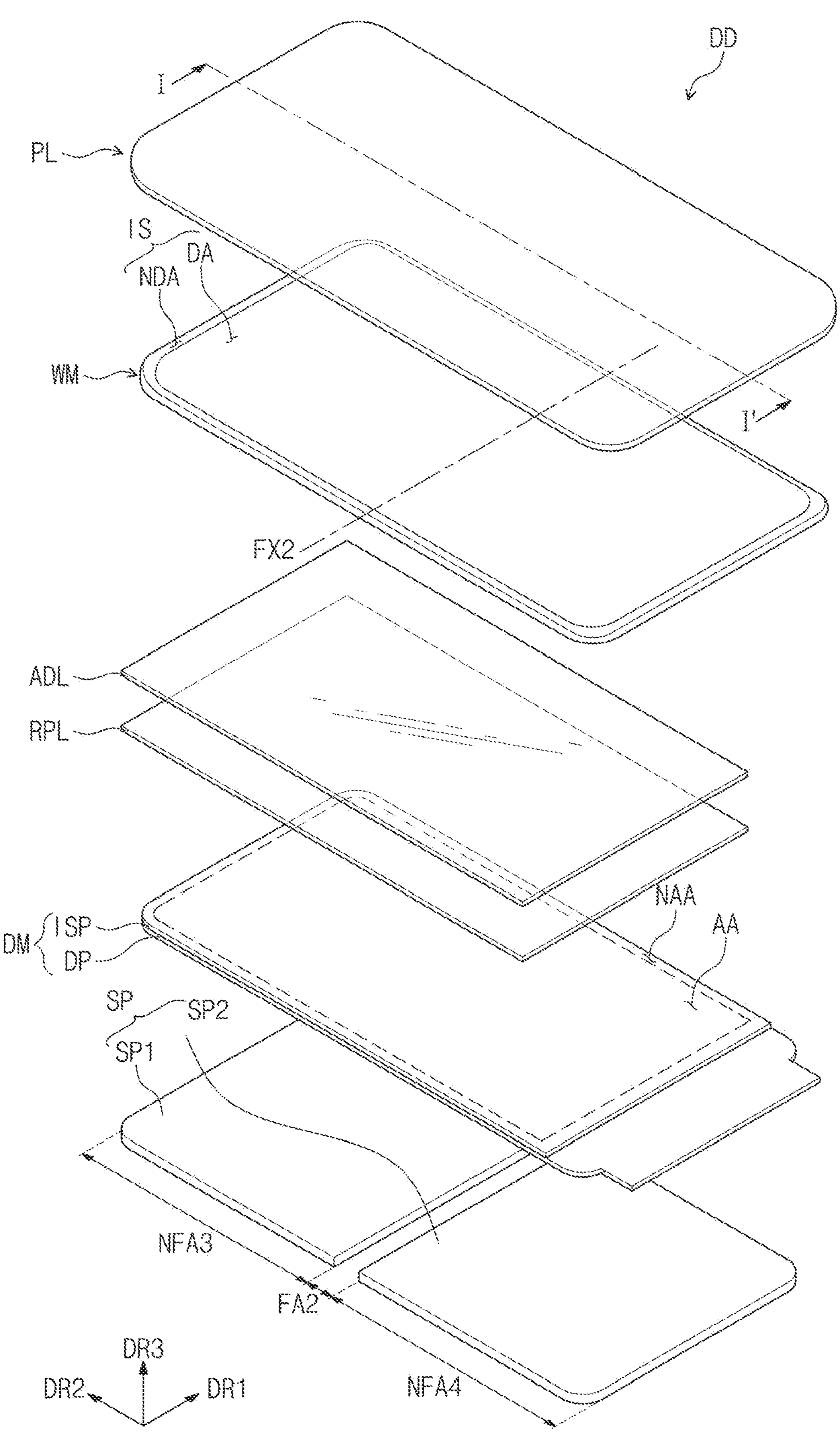
FIG. 4 is an exploded perspective view of a display device according to some embodiments of the present disclosure.
Figure 5:
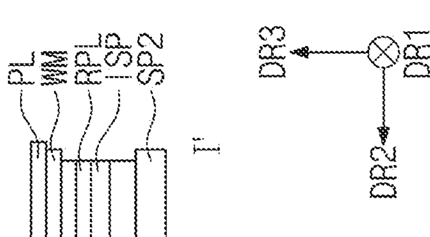
FIG. 5 is a cross-sectional view taken along the cutting line I-I' illustrated in FIG. 4.
Figure 5:
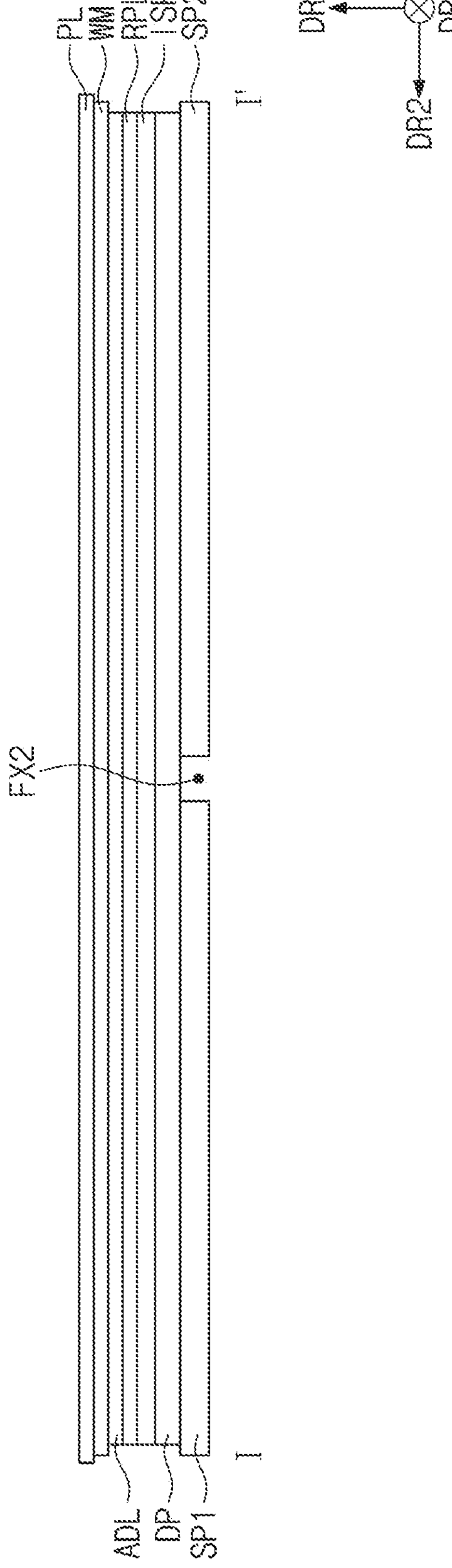
Figure 6:
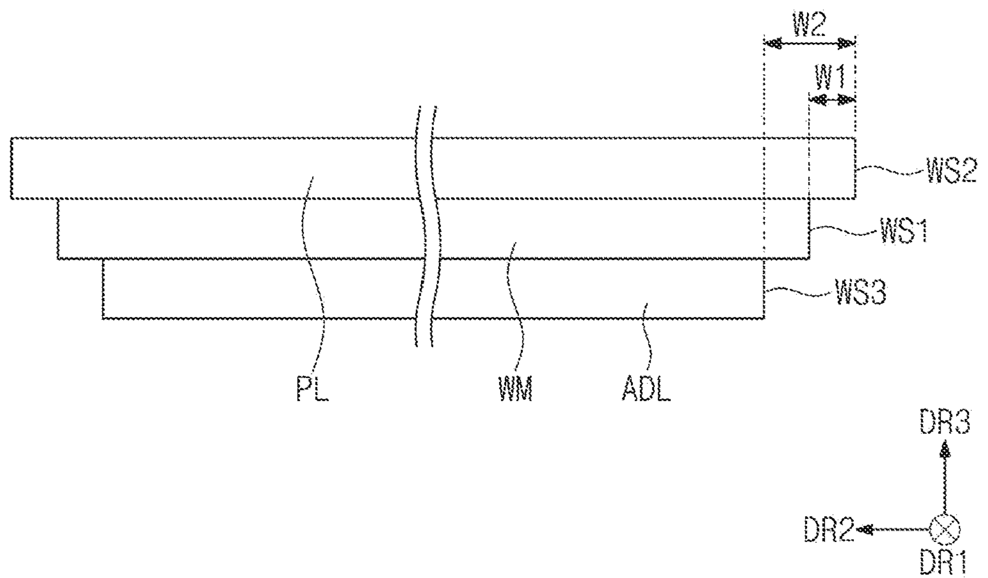
FIG. 6 is a magnified view of a part of a display module according to some embodiments of the present disclosure.

FIG. 4 is an exploded perspective view of a display device according to some embodiments. FIG. 5 is a cross-sectional view of a display device according to some embodiments. FIG. 6 is a cross-sectional view of a part of a display device according to some embodiments. FIG. 5 may be a cross-sectional view taken along the cutting line I-I' illustrated in FIG. 4.

Referring to FIGS. 4 to 6, a display device DD according to some embodiments includes a display module (e.g., a display panel) DM that displays an image, a window WM disposed on the display module DM, and a protective layer PL disposed on the window WM. The display module DM may constitute a part of the display device DD (see, e.g., FIG. 1).

The display module DM may include a display panel DP and an input-sensing unit ISP. The display panel DP according to some examples may be a light-emitting display panel; however, embodiments of the present disclosure are not limited thereto. For example, the display panel DP may be an organic light-emitting display panel or a quantum dot light-emitting display panel. A light-emitting layer of the organic light-emitting display panel may include an organic light-emitting material. A light-emitting layer of the quantum dot light-emitting display panel may include quantum dots, quantum rods, etc. Hereinafter, the display panel DP is described as an organic light-emitting display panel.

The display panel DP may be a flexible display panel. Accordingly, the display panel DP may be entirely rolled, or may be folded or unfolded with respect to the second folding axis FX2.

The input-sensing unit ISP may be directly disposed on the display panel DP. According to some embodiments, the input-sensing unit ISP may be formed on the display panel DP through a single continuous process. That is, when the input-sensing unit ISP is directly disposed on the display panel DP, an adhesive film is not disposed between the input-sensing unit ISP and the display panel DP; however, embodiments of the present disclosure are not limited thereto. For example, an adhesive film may be disposed between the input-sensing unit ISP and the display panel DP. In such examples, the input-sensing unit ISP and the display panel DP are not manufactured through a single continuous process, and are manufactured through separate processes, and then, the input-sensing unit ISP may be fixed on the upper surface of the display panel DP by an adhesive film.

The display panel DP generates an image, and the input-sensing unit ISP acquires coordinate information about a user's input (for example, a touch event).

The window WM may be disposed on the display module DM. The window WM may include an optically transparent insulating material. Accordingly, an image generated by the display module DM may be visible through the window WM to be easily viewed by a user.

For example, the window WM may include a glass substrate or a synthetic resin film. When the window WM is a thin-film glass, the window WM may have a thickness of about 80 μm or less, for example, about 30 μm, but the thickness of the window WM is not limited thereto.

When the window WM is a synthetic resin film, the window WM may include a polyimide (PI) film or a polyethylene terephthalate (PET) film.

The window WM may have a single- or multi-layered structure. For example, the window WM may include a plurality of synthetic resin films bonded with an adhesive, or a glass substrate and a synthetic resin film bonded with an adhesive. The window WM is made of a ductile material. Accordingly, the window WM may be folded or unfolded with respect to the second folding axis FX2. That is, when the display module DM changes in shape, the window WM may also change in shape accordingly.

The window WM transmits an image from the display module DM, and absorbs external impacts, thereby preventing the display module DM from being damaged or malfunctioning, or substantially reducing the likelihood thereof, due to an external impact. The wording, "an external impact" means an external force such as pressure, stress, or the like, which may cause a defect in the display module DM.

The protective layer PL is disposed on the window WM. The protective layer PL may be a layer for protecting the window WM from an external impact, and preventing the window WM from breaking apart (e.g., being shattered and scattered) when the window WM is damaged. The structure of the protective layer PL will be further described later with reference to FIGS. 7 and 8.

At least one functional layer may be disposed between the display module DM and the window WM. For example, in the display device DD according to some embodiments, an anti-reflective layer RPL, which blocks external light from being reflected, may be included between the display module DM and the window WM. The anti-reflective layer RPL may prevent or substantially prevent elements constituting the display module DM from being viewed from the outside due to external light incident through the front surface of the display device DD. The anti-reflective layer RPL may include a retarder and a polarizer. The retarder may be of a film type or of a liquid crystal coating type, and may include a half-wavelength (λ/2) retarder and/or a quarter-wavelength (λ/4) retarder. The polarizer may be also a film type one or a liquid crystal coating type one. The film type polarizer may include an elongated synthetic resin film, and the liquid crystal coating type polarizer may include liquid crystals arrayed in a predetermined arrangement. The retarder and the polarizer may be configured as a single polarizing film. The display device DD according to some embodiments further includes a protective film disposed on top of or under the anti-reflective layer RPL.

The anti-reflective layer RPL may be disposed on the input-sensing unit ISP. That is, the anti-reflective layer RPL may be disposed between the input-sensing unit ISP and the window WM. The anti-reflective layer RPL and the window WM may be bonded to each other through an adhesive film ADL. In some examples, an adhesive film, which fixes the anti-reflective layer RPL to the input-sensing unit ISP, may be further disposed between the input-sensing unit ISP and the anti-reflective layer RPL.

As an example, the adhesive film ADL may include an optically clear adhesive film (OCA). However, the adhesive film ADL is not limited thereto, and may include a typical bonding agent or adhesive. For example, the adhesive film ADL may include an optically clear resin (OCR), or a pressure sensitive adhesive film (PSA).

The display module DM may display an image in response to an electrical signal, and may transmit/receive information about an external input. The display module DM may be defined as an active region AA and a peripheral region NAA. The active region AA may be defined as a region through which an image supplied by the display module DM is transmitted.

The peripheral region NAA is adjacent to the active region AA. For example, the peripheral region NAA may surround (e.g., all sides of) the active region AA. However, this is illustrated as an example, the peripheral region NAA may be defined in various shapes, and is not limited to any one embodiment. According to some embodiments, the active region AA of the display module DM may correspond to at least a part of the display region DA.

As illustrated in FIGS. 4 and 5, the display device DD further includes a support plate SP disposed on the rear surface of the display module DM, and supporting the display module DM. The support plate SP may be a metal plate. The support plate SP may be a stainless-steel plate. The support plate SP may have a greater strength and/or stiffness than the display module DM.

The support plate SP may include support plates SP1 and SP2 the number of which corresponds to the number of non-folding regions NFA3 and NFA4. For example, the support plate SP may include a first support plate SP1 and a second support plate SP2 disposed apart from the first support plate SP1. The first and second support plates SP1 and SP2 may be disposed corresponding to the non-folding regions NFA3 and NFA4. That is, the first support plate SP1 is disposed corresponding to a third non-folding region NFA3 of the display module DM, and the second support plate SP2 is disposed corresponding to a fourth non-folding region NFA4 of the display module DM. When the display module DM is folded with respect to the second folding axis FX2, the first and second support plates SP1 and SP2 may be disposed apart from each other in the second direction DR2.

The first and second support plates SP1 and SP2 may be spaced apart from each other with the folding region FA2 therebetween. The first and second support plates SP1 and SP2 may partially overlap the folding region FA2. That is, in the second direction DR2, a distance between the first and second support plates SP1 and SP2 may be smaller than the width of the folding region FA2.

The support plate SP may further include a connection module for connecting the first and second support plates SP1 and SP2. The connection module may include, for example, a hinge module or a polyarticular module.

It is illustrated that the support plate SP includes two second support plates SP1 and SP2; however, embodiments of the present disclosure are not limited thereto. That is, when the number of folding axes FX2 increases, the support plate SP may include a plurality of support plates divided (e.g., separated or spaced apart) with respect to the folding axes FX2.

FIG. 4 illustrates a structure in which the support plate SP is divided into the first and second support plates SP1 and SP2; however, embodiments of the present disclosure are not limited thereto. That is, the support plate SP may be formed in the form of a one-body plate disposed corresponding to the first and second non-folding regions NFA3 and NFA4 and the folding region FA2. Here, the support plate SP may include a plurality of holes formed penetrating the support plate SP formed in the folding region FA2.

A buffer film may be further disposed between the display module DM and the support plate SP. The buffer film may include a polymer material. The buffer film may be a layer for absorbing an impact applied from the outside. The buffer film may be bonded to the display module DM and the support plate SP through an adhesive film.

As illustrated in FIGS. 4 to 6, a sidewall WS1 of the window WM may be disposed more inward than a sidewall WS2 of the protective layer PL. The wording, "being disposed more inward" may mean that one object is closer to the active region AA than another comparative object. That is, the sidewall WS1 of the window WM may not protrude outward more than the sidewall WS2 of the protective layer PL. Accordingly, the protective layer PL may block or substantially prevent an external impact from being transferred to the sidewall WS1 of the window WM, and as a result, probability of occurrence of cracks in the window WM may decrease.

Here, the sidewall WS1 of the window WM may be disposed, by a first width W1, more inward than the sidewall WS2 of the protective layer PL. Here, the first width W1 may refer to a width in a direction parallel to the second direction DR2. In addition, when viewed on a plane, the first width W1 may correspond to a distance between the sidewall WS1 of the window WM and the sidewall WS2 of the protective layer PL.

As the first width W1 becomes greater, the sidewall WS2 of the protective layer PL protrudes more than the sidewall WS1 of the window WM, and as a result, the probability of occurrence of cracks in the window WM may become lower.

In addition, the adhesive film ADL is disposed on the rear surface of the window WM. A sidewall WS3 of the adhesive film ADL may be disposed more inward than the sidewall WS2 of the protective layer PL. The wording, "being disposed more inward" may mean that one object is closer to the active region AA than another comparative object. Particularly, the sidewall WS3 of the adhesive film ADL may protrude out less than the sidewall WS1 of the window WM.

Here, the sidewall WS3 of the adhesive film ADL may be disposed, by a second width W2, more inward than the sidewall WS2 of the protective layer PL. When viewed on a plane, the second width W2 may correspond to a distance between the sidewall WS2 of the protective layer PL and the sidewall WS3 of the adhesive film ADL. Here, the second width W2 may mean a width in a direction parallel to the second direction DR2.

In addition, the second width W2 may be greater than or equal to the first width W1. That is, when the second width W2 is greater than the first width W1, the sidewall WS3 of the adhesive film ADL may be disposed more inward than the sidewall WS1 of the window WM. When the second width W2 is equal to the first width W1, the sidewall WS3 of the adhesive film ADL and the sidewall WS1 of the window WM may be disposed on the same line.

Figure 7:
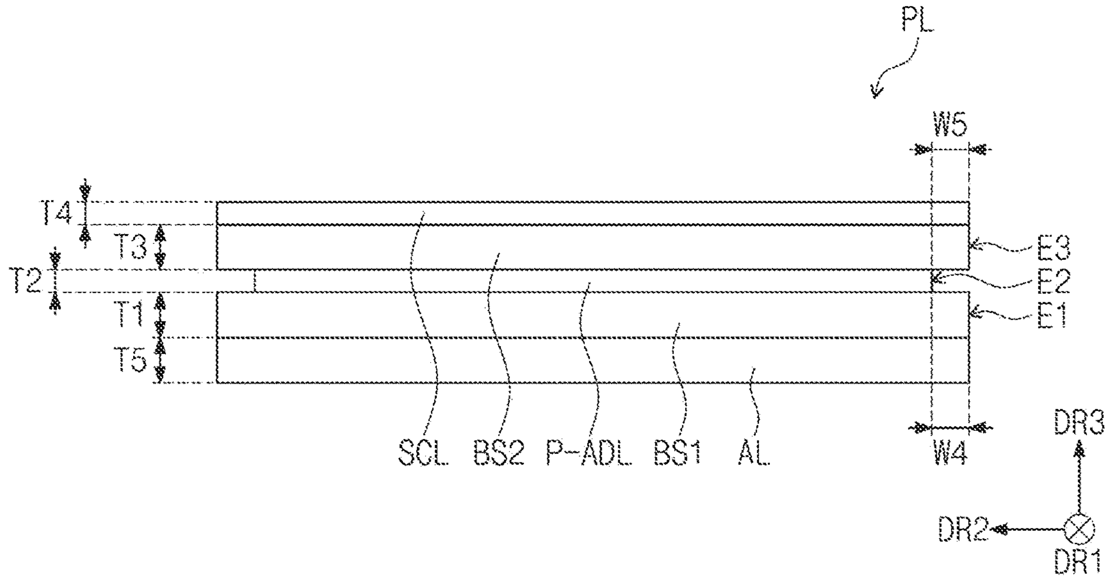
FIG. 7 is a cross-sectional view illustrating a protective layer according to some embodiments of the present disclosure.
Figure 8:
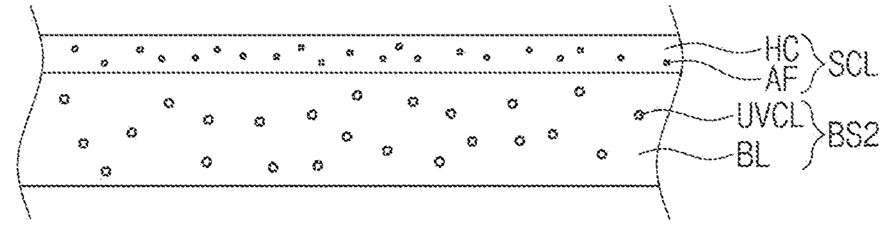
FIG. 8 is a magnified view of a part of a protective layer according to some embodiments of the present disclosure.
Figure 9A:
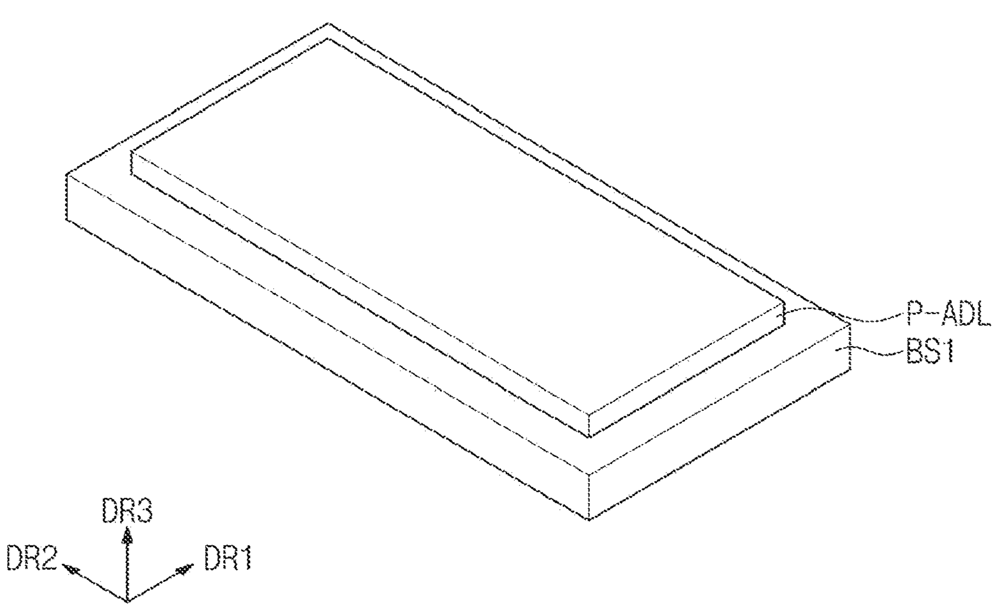
FIG. 9A is a perspective view illustrating a part of a protective layer according to some embodiments of the present disclosure.
Figure 9B:
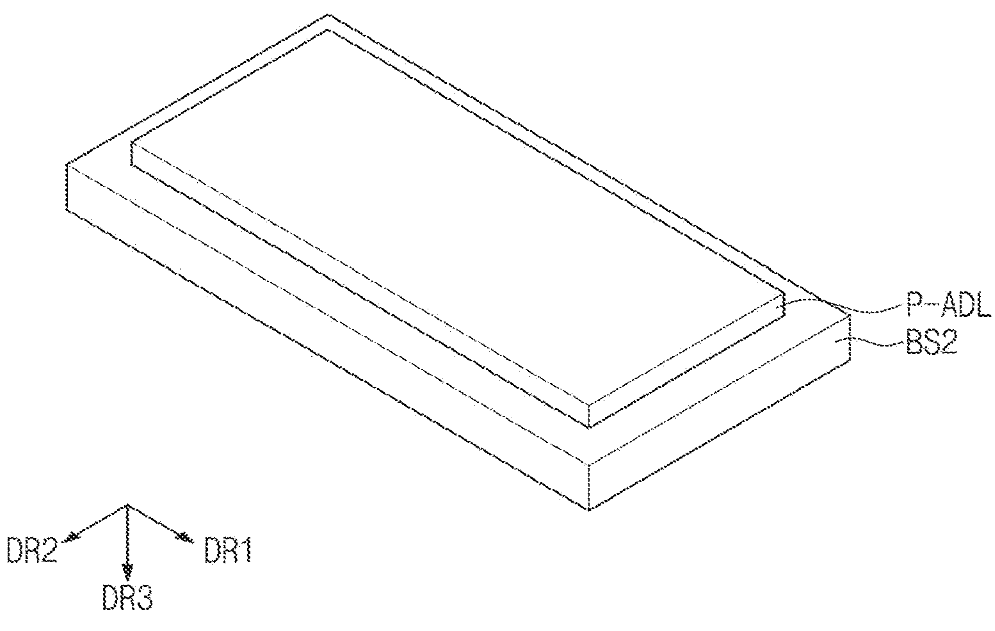
FIG. 9B is a perspective view illustrating a part of a protective view according to some embodiments of the present disclosure.

FIG. 7 is a cross-sectional view illustrating a protective layer according to some embodiments of the present disclosure. FIG. 8 is an enlarged cross-sectional view illustrating a surface coating layer and a base layer illustrated in FIG. 7. FIG. 9A is a perspective view illustrating a part of the protective layer according to some embodiments of the present disclosure. FIG. 9B is a perspective view illustrating a part of the protective layer according to some embodiments of the present disclosure.

Referring to FIGS. 7 and 8, the protective layer PL may include a first base layer BS1, a base adhesive layer P-ADL, a second base layer BS2, and a surface coating layer SCL. The protective layer PL according to some embodiments further includes an adhesive layer AL.

The first base layer BS1 and the second base layer BS2 may each include a base material BL. FIG. 8 exemplarily illustrates only the second base layer BS2, but description of the second base layer BS2 may be similarly applied to the first base layer BS1. The base material BL may include phenylene, polyethylene terephthalate (PET), polyimide (PI), polyamide (PAI), polyethylene naphthalate (PEN), polycarbonate (PC), thermoplastic polyurethane (TPU), and/or the like. Meanwhile, the base material BL included in the first base layer BS1 and the base material BL included in the second base layer BS2 may be different from each other. For example, the base material BL of the first base layer BS1 may be polyethylene terephthalate, and the base material BL of the second base layer BS2 may be thermoplastic polyurethane, or polyimide. However, this is merely an example, and embodiments of the present disclosure are not limited thereto. The base materials BL included in the first base layer BS1 and the second base layer BS2 may be the same as polyethylene terephthalate.

The base layers BS1 and BS2 may further include an ultraviolet-blocking material (UVCL) added to the base material BL. In some embodiments, the ultraviolet-blocking material may include an inorganic chemical material such as zinc oxide (ZnO), and/or titanium oxide ($TiO_2$). The ultraviolet-blocking material may serve a function of reflecting or scattering ultraviolet rays. Because the ultraviolet-blocking material is included in the base layers BS1 and BS2, the protective layer PL may have an ultraviolet-blocking function. As an example, the protective layer PL may transmit less than about 20% of ultraviolet rays having a wavelength of about 380 nm or less. In particular, when the window WM includes a thin-film glass, the ultraviolet-blocking function of the window WM may be deteriorated (e.g., the ability of the window WM to block ultraviolet light may be reduced). To overcome this effect, an ultraviolet-blocking material is included in the base layers BS1 and BS2, thus making it possible for the protective layer PL to perform an ultraviolet-blocking function.

A thickness T1 of the first base layer BS1 and a thickness T3 of the second base layer BS2 may each be about 35 μm to about 50 μm. The thickness T1 of the first base layer BS1 and the thickness T3 of the second base layer BS2 may be the same as, or different from each other. When the thickness T1 of the first base layer BS1 or the thickness T3 of the second base layer BS2 is less than about 35 μm, the protective layer PL may not have sufficient impact resistance. In addition, when the thickness T1 of the first base layer BS1 or the thickness T3 of the second base layer BS2 is greater than about 50 μm, the protective layer PL is so thick that the folding characteristics of the display device DD (see, e.g., FIG. 1) including the protective layer PL may be deteriorated (e.g., the ability of the protective layer PL to fold or bend may be reduced).

A tensile modulus of the first base layer BS1 and a tensile modulus of the second base layer BS2 may each be about 3.5 GPa to about 5.0 GPa. The tensile modulus of the first base layer BS1 and the tensile modulus of the second base layer BS2 may be the same as, or different from each other. When the tensile modulus of the first base layer BS1 or the tensile modulus of the second base layer BS2 is less than about 3.5 GPa, the protective layer PL may not have sufficient impact resistance. When the tensile modulus of the first base layer BS1 or the tensile modulus of the second base layer BS2 is greater than about 5.0 GPa, the folding characteristics of the display device DD (see, e.g., FIG. 1) including the protective layer PL may be deteriorated (e.g., the ability of the protective layer PL to bend or fold may be reduced).

The first base layer BS1 and the second base layer BS2 may each be an elongated film having a controlled optical axis. The first base layer and the second base layer may each have a difference between the tensile modulus on a first elongation axis and the tensile modulus on a second elongation axis of about 1.1 GPa or less. When the first base layer and the second base layer each have a difference between the tensile modulus along a first elongation axis and the tensile modulus along a second elongation axis of greater than about 1.1 GPa, the shrinkage deformation of the first base layer BS1 and the second base layer BS2 may increase.

The base adhesive layer P-ADL may be disposed between the first base layer BS1 and the second base layer BS2. The base adhesive layer P-ADL may bond the first base layer BS1 and the second base layer BS2. The base adhesive layer P-ADL may include a silicone adhesive. However, this is merely an example, and the material of the base adhesive layer P-ADL is not limited thereto.

The base adhesive layer P-ADL may have a tensile modulus of about 0.1 GPa to about 4.5 GPa. When the tensile modulus of the base adhesive layer P-ADL is less than or equal to about 0.1 GPa, the base adhesive layer P-ADL may fail to bond the first base layer BS1 and the second base layer BS2. When the tensile modulus of the base adhesive layer P-ADL is greater than about 4.5 GPa, the folding characteristics of the protective layer PL may be deteriorated (e.g., the ability of the protective layer PL to bend or fold may be reduced).

TABLE 1

| Thickness of base adhesive layer (μm) | 1 | 2 | 3 | 4 | 4.5 | 5 |
|---|---|---|---|---|---|---|
| Adhesion (gf/inch) | 33 | 400 | 570 | 648 | 722 | 397 |

The base adhesive layer P-ADL may have a thickness T2 of about 3 μm to about 4.5 μm. The thickness T2 of the base adhesive layer P-ADL may be determined, like the following, in consideration of adhesion of the base adhesive layer P-ADL, the impact resistance of and the folding characteristics of the protective layer PL.

Referring to Table 1, it may be seen that when the thickness T2 of the base adhesive layer P-ADL is equal to or greater than about 2 μm, the adhesion of the base adhesive layer P-ADL has a remarkable value corresponding to about ten times of a value which when the thickness T2 of the base adhesive layer P-ADL is about 1 μm, the adhesion of the base adhesive layer P-ADL has, and as the base adhesive layer P-ADL becomes thicker, the base adhesive layer P-ADL has a tendency to have a greater adhesion. However, it may be seen that when the thickness T2 of the base adhesive layer P-ADL is greater than about 4.5 μm, the adhesion decreases on the contrary. That is, it may be seen that the adhesion of the base adhesive layer P-ADL is remarkable in a range in which the thickness T2 of the base adhesive layer P-ADL is about 2 μm to about 5 μm, but decreases on the contrary in a range equal to or greater than 4.5 μm. Accordingly, an appropriate range of the thickness T2 of the base adhesive layer P-ADL considering the adhesion of the base adhesive layer P-ADL corresponds to about 2 μm to about 4.5 μm.

When the thickness T2 of the base adhesive layer P-ADL is less than about 3 μm, the protective layer PL may not have sufficient impact resistance. When the thickness T2 of the base adhesive layer P-ADL is greater than about 5 μm, the folding characteristics of the protective layer PL may be deteriorated (e.g., the ability of the protective layer PL to fold or bend may be reduced).

Accordingly, it may be seen that when the thickness T2 of the base adhesive layer P-ADL is about 3 μm to about 4.5 μm, there are remarkable effects in the adhesion of the base adhesive layer P-ADL, and the impact resistance and the folding characteristics of the protective layer PL.

An edge part E2 of the base adhesive layer P-ADL may be disposed more inward than an edge part E1 of the first base layer BS1 and an edge part E3 of the second base layer BS2. Here, the wording, "being disposed more inward" means that one object is disposed relatively closer or more adjacent to the active region AA (see, e.g., FIG. 1). The edge part E2 of the base adhesive layer P-ADL may be disposed, by a first width W4, more inward than the edge part E1 of the first base layer BS1 (e.g., may be inset, by a first width W4, relative to the edge part E1 of the first base layer BS1). The edge part E2 of the base adhesive layer P-ADL may be disposed, by a second width W5, more inward than the edge part E3 of the second base layer BS2 (e.g., may be inset, by a second width W4, relative to the edge part E3 of the second base layer BS2).

Since the edge portion of the edge part E2 of the base adhesive layer P-ADL may be disposed more inward than (e.g., inset relative to) the edge part E1 of the first base layer BS1 and the edge part E3 of the second base layer BS2, the impact resistance of the protective layer PL may increase. The first base layer BS1 and the second base layer BS2 may each include a part not overlapping the base adhesive layer P-ADL. The part, of each of the first base layer BS1 and the second base layer BS2, not overlapping the base adhesive layer P-ADL may perform a function of absorbing an external impact. The part, of each of the first base layer BS1 and the second base layer BS2, not overlapping the base adhesive layer P-ADL may consume (e.g., absorb), through vibration, energy generated by an external impact, thereby reducing the amount of the external impact transferred to another layer.

The first width W4 and the second width W5 may each be about 450 μm to about 600 μm. The first width W4 and the second width W5 may be the same as, or different from each other. When the first width W4 or the second width W5 is less than about 450 μm, the base adhesive layer P-ADL may leak out during a folding operation of the display device DD (see, e.g., FIG. 1). When the first width W4 or the second width W5 is greater than about 600 μm, foreign matters may enter the space between the first base layer BS1, the second base layer BS2, and the base adhesive layer P-ADL, thereby adversely affecting the reliability of the display device DD (see, e.g., FIG. 1).

Since the protective layer PL according to some embodiments includes the first base layer BS1 and the second base layer BS2 bonded by the base adhesive layer P-ADL, the display device DD may easily control the thickness thereof, and have an improved impact resistance, compared with a case in which the protective layer includes a single base layer. An impact transferred from the outside is transferred to the second base layer BS2, the first base layer BS1, and the window WM in sequence, and is then dispersed while passing through the base layers BS1 and BS2 of the protective layer PL. Accordingly, the impact transferred from the outside to the window WM may decrease.

Referring FIGS. 9A and 9B, when viewed on a plane (e.g., when viewed in a plan view), the base adhesive layer P-ADL may have a smaller area than the first base layer BS1, and have a smaller area than the second base layer BS2.

The surface coating layer SCL may include a hard coating material HC, and an anti-fingerprint material AF added to the hard coating material HC. The surface coating layer SCL has a single-film structure. That is, the surface coating layer SCL includes a single layer including the hard coating material HC and the anti-fingerprint material AF. The hard coating material HC may include a material having a high strength of pencil hardness F or higher. As an example, the hard coating material HC may include a siloxane resin, an epoxy resin, an acryl-based resin, and/or the like. The surface coating layer SCL may have a Vickers hardness number of about 40 or more.

The siloxane resin may include inorganic particles surface-treated with silsesquioxane, a siloxane compound, and silane. Silsesquioxane may be a ladder-type silsesquioxane. Silsesquioxane may be included in an amount of about 30 wt % to about 60 wt % with respect to the total weight of the hard coating material HC. When silsesquioxane is included in an amount of less than about 30 wt %, the flexibility of the surface coating layer SCL according to some examples may not be improved. When silsesquioxane is included in an amount of greater than about 60 wt %, the surface hardness of the surface coating layer SCL according to some examples may be deteriorated (e.g., reduced).

The siloxane compound may have at least one acrylate functional group. For example, the siloxane compound may have an acrylate group as a terminal group. For example, the siloxane compound may be a siloxane polymer or siloxane oligomer having an acrylate group as a terminal group. In some embodiments, the siloxane compound may be supplied as a polymer integrally formed with silsesquioxane.

The siloxane compound may be included in an amount of about 10 wt % to about 40 wt % with respect to the total weight of the hard coating material HC. When the amount of the siloxane compound is less than about 10 wt %, the strength and surface hardness of the surface coating layer SCL may be deteriorated (e.g., reduced). When the amount of the siloxane is greater than about 40 wt %, the brittleness of the surface coating layer SCL may increase so that the flexibility of the display device DD may be deteriorated (e.g., reduced) and the probability of occurrence of cracks may increase during bending.

The hard coating material HC according to some embodiments includes surface-treated inorganic particles. The surface-treated inorganic particles may be inorganic particles surface-treated with silane. In some embodiments, the inorganic particles that are surface-treated with silane may be inorganic particles surface-treated with a silane coupling agent. For example, the average size of the inorganic particles is about 10 nm to about 50 nm. The average size of the inorganic particles may represent the average diameter of the inorganic particles. For example, the average diameter of the inorganic particles may be about 10 nm to about 30 nm.

In some embodiments, when the average size of the inorganic particles is greater than about 50 nm, the optical transparency of the surface coating layer SCL may be deteriorated (e.g., reduced). In addition, when the average size of the inorganic particles is less than about 10 nm, the effect of improving the surface hardness in the surface coating layer SCL may be insignificant.

The inorganic particles may be $SiO_2$, $TiO_2$, $Al_2O_3$, $ZrO_2$, ZnO, AlN, $Si_3N_4$, or a combination thereof. That is, the inorganic particles may include at least one of $SiO_2$, $TiO_2$, $Al_2O_3$, $ZrO_2$, ZnO, AlN, or $Si_3N_4$. The hard coating material HC according to some examples may include $SiO_2$ surface-treated with silane, $TiO_2$ surface-treated with silane, $Al_2O_3$ surface-treated with silane, $ZrO_2$ surface-treated with silane, ZnO surface-treated with silane, AlN surface-treated with silane, $Si_3N_4$ surface-treated with silane, or a mixture thereof.

The hard coating material HC according to some embodiments includes about 10 wt % to about 30 wt % of the inorganic particles surface-treated with silane, with respect to the total weight thereof. When the content of the inorganic particles is less than about 10 wt %, the surface hardness and the strength of the surface coating layer SCL may be deteriorated (e.g., reduced). When the content of the inorganic particle is greater than about 30 wt %, the compatibility of the inorganic particles may be deteriorated (e.g., reduced).

The epoxy resin or the acryl-based resin is a monomer or oligomer including at least one of an epoxy group, an oxetane group, an acrylate group, a methacrylate group, a urethane acrylate group, or an ethyleneoxide (EO) addition type acrylate group, and may have flexibility. For example, the epoxy resin may be at least one selected from the group consisting of a glycidyl-type epoxy resin, an alicyclic epoxy resin, and an oxetane-based resin.

The glycidyl-type epoxy resin may be a bisphenol A type epoxy resin, a bisphenol F type epoxy resin, a bisphenol S type epoxy resin, a naphthalene type epoxy resin or a hydrogenated substance thereof, an epoxy resin having a dicyclopentadiene skeleton, an epoxy resin having a triglycidyl isocyanurate skeleton, an epoxy resin having a cardo skeleton, and an epoxy resin having a polysiloxane structure.

The alicyclic epoxy resin may be 3,4-epoxycyclohexylmethyl-3',4'-epoxycyclohexanecarboxylate, 1,2,8,9-diepoxylimonene, an epoxy resin respectively having ester bonds of 3,4-epoxycyclohexylmethanol and 3,4-epoxycyclohexanecarboxylic acid at both ends of the ε-caprolactone oligomer, and an epoxy resin having a hydrogenated bisphenol A skeleton.

The oxetane-based resin may be an oxetane resin having a hydroxy structure and an oxetane resin having a methoxymethyl benzene structure.

The acryl-based resin is a monomer or oligomer including at least one selected from the group consisting of an acrylate group, a methacrylate group, a urethane acrylate group, and an ethyleneoxide (EO) addition type acrylate group.

For example, the acryl-based resin is bisphenol-A ethyleneoxide diacrylate, bisphenol-A ethyleneoxide dimethacrylate, bisphenol-A ethoxylate diacrylate, bisphenol-A ethoxylate diacrylate, bisphenol-A polyethoxylate diacrylate, bisphenol-A diacrylate, bisphenol-S diacrylate, dicyclopentadienyl diacrylate, pentaerythritol triacrylate, tris(2-hydroxyethyl)isocyanurate triacrylate, pentaerythritol tetraacrylate, bisphenol-A dimethacrylate, bisphenol-S dimethacrylate, dicyclopentadienyl dimethacrylate, pentaerythritol trimethacrylate, tris(2-hydroxyethyl)isocyanurate trimethacrylate, pentaerythritol tetramethacrylate, etc.

The anti-fingerprint material AF may include a water-repellent material or an oil-repellent material to improve stain resistance of the surface coating layer SCL. As an example, the anti-fingerprint material AF may be inorganic materials including a fluorine-based material. The fluorine-based material may include polytetrafluoroethylene (PTFE), polyvinylidenefluoride (PVDF), or amorphous fluorine (teflon AF, cytop).

The surface coating layer SCL may have a surface contact angle of about 110° to about 120° due to the anti-fingerprint material AF. The surface contact angle may be changed according to a weight ratio of the anti-fingerprint material AF to the surface coating layer SCL. For example, the weight percentage of the anti-fingerprint material AF may be greater than 0 wt % and less than or equal to about 10 wt % with respect to the total weight of the surface coating layer SCL. When the weight percentage of the anti-fingerprint material AF is greater than about 10 wt %, the surface hardness of the surface coating layer SCL may be deteriorated.

The surface coating layer SCL may have a thickness of about 3 μm to about 10 μm. In particular, the surface coating layer SCL may have a thickness of about 4 μm to about 6 μm; however, embodiments of the present disclosure are not limited thereto. When the surface coating layer SCL has a thickness of greater than about 10 μm, the flexibility thereof may be deteriorated (e.g., reduced). When the surface coating layer SCL has a thickness less than about 3 μm, the surface hardness of the surface coating layer SCL may be deteriorated (e.g., reduced). The adhesive layer AL may be disposed under the first base layer BS1.

The adhesive layer AL may be disposed between the first base layer BS1 and the window WM (see, e.g., FIG. 5). The adhesive layer AL may include a pressure sensitive adhesive material; however, embodiments of the present disclosure are not limited thereto. The adhesive layer AL may also include an optically clear adhesive resin. The adhesive layer AL may have a thickness T5 of about 25 μm to about 70 μm. When the adhesive layer AL has a thickness T5 of less than about 25 μm, the protective layer PL may not have sufficient impact resistance. When the adhesive layer AL has a thickness T5 of greater than about 70 μm, the folding characteristics of the display device DD (see, e.g., FIG. 1) may be deteriorated (e.g., the ability of the display device DD to fold or bend may be reduced).

In addition, the protective layer PL may have a total light transmittance of about 90% or more, and may have a haze value less than or equal to about 1%. When the haze value is greater than about 1%, the light transmittance of the protective layer PL may be deteriorated (e.g., reduced).

FIGS. 10A to 10F are each a cross-sectional view of a protective layer according to some embodiments. Content that is common with those described about the protective layer with reference to FIGS. 1 to 9B may not be repeater, and differences may be mainly described below.

Referring to FIGS. 10A to 10F, protective layers PL-1 to PL-6 according to some embodiments includes at least one hard coating layer HC1 to HC4. In the protective layers PL-1 to PL-6 according to some embodiments, the hard coating layers HC1 to HC4 may increase the impact resistance of the protective layers PL-1 to PL-6. At least one hard coating layer HC1 to HC4 may include a hard coating material. The hard coating material may include a material having a high strength of pencil hardness F or higher. As an example, the hard coating material may include a siloxane resin, an epoxy resin, or an acryl-based resin and/or the like. The same content described about the hard coating layer HC (see, e.g., FIG. 8) included in the surface coating layer SCL (see, e.g., FIG. 8) may be applied to the hard coating material.

Figure 10A:
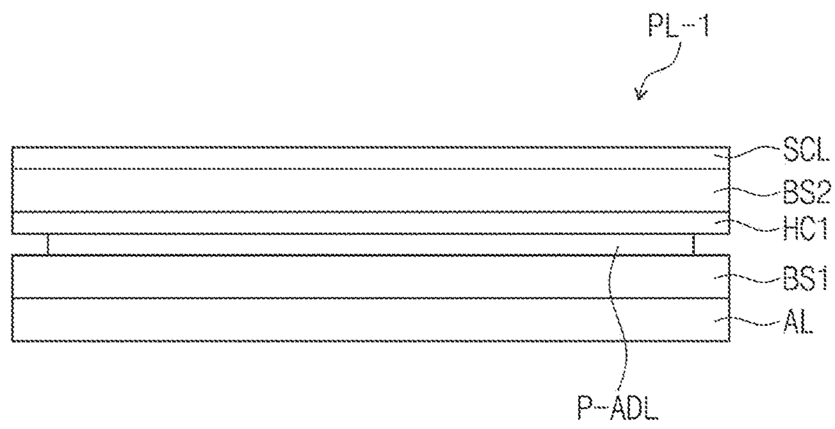
FIG. 10A is a cross-sectional view illustrating a protective layer according to some embodiments of the present disclosure.
Figure 10B:
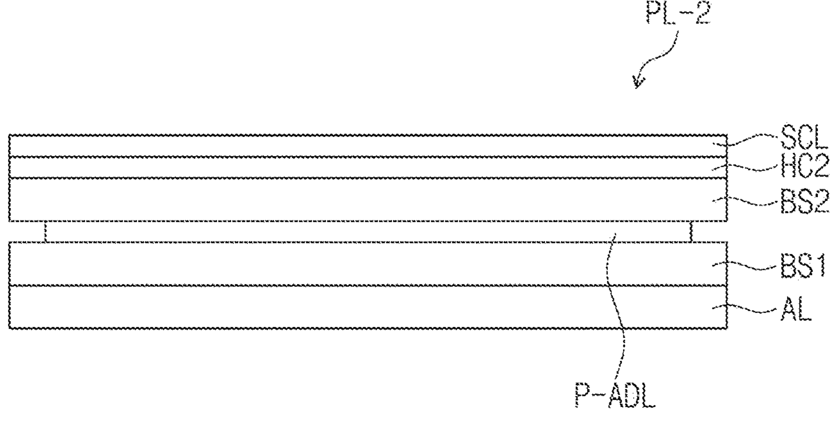
FIG. 10B is a cross-sectional view illustrating a protective layer according to some embodiments of the present disclosure.
Figure 10C:
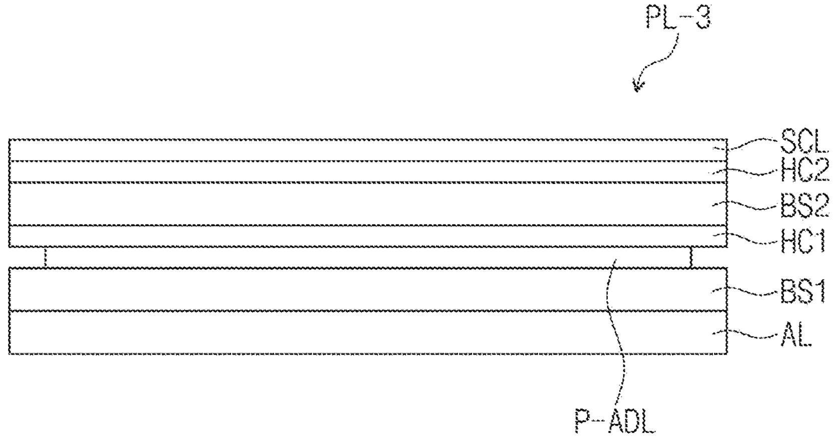
FIG. 10C is a cross-sectional view illustrating a protective layer according to some embodiments of the present disclosure.

Referring FIG. 10A, a protective layer PL-1 according to some embodiments further includes a first hard coating layer HC1 disposed between the second base layer BS2 and the base adhesive layer P-ADL. Referring to FIG. 10B, a protective layer PL-2 according to some embodiments further includes a second hard coating layer HC2 disposed between the second base layer BS2 and the surface coating layer SCL. Referring to FIG. 10C, a protective layer PL-3 according to some embodiments further includes the first hard coating layer HC1 disposed between the second base layer BS2 and the base adhesive layer P-ADL, and the second hard coating layer HC2 disposed between the second base layer BS2 and the surface coating layer SCL.

Figure 10D:
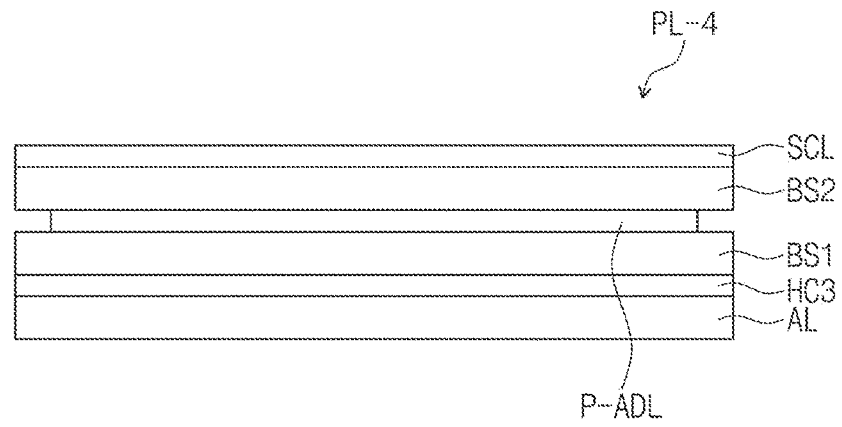
FIG. 10D is a cross-sectional view illustrating a protective layer according to some embodiments of the present disclosure.
Figure 10E:
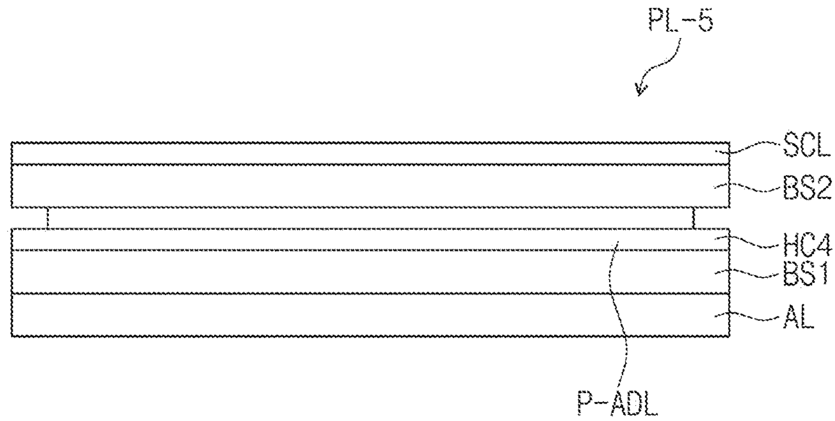
FIG. 10E is a cross-sectional view illustrating a protective layer according to some embodiments of the present disclosure.
Figure 10F:
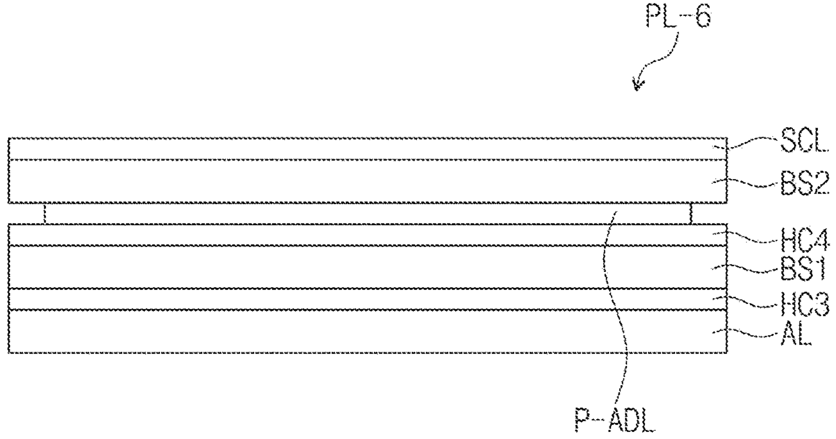
FIG. 10F is a cross-sectional view illustrating a protective layer according to some embodiments of the present disclosure.

Referring to FIG. 10D, a protective layer PL-4 according to some embodiments further includes a third hard coating layer HC3 disposed under the first base layer BS1. Referring to FIG. 10E, a protective layer PL-5 according to some embodiments further includes a fourth hard coating layer HC4 disposed between the first base layer BS1 and the base adhesive layer P-ADL. Referring to FIG. 10F, a protective layer PL-6 according to some embodiments further includes the third hard coating layer HC3 disposed under the first base layer BS1, and the fourth hard coating layer HC4 disposed between the first base layer BS1 and the base adhesive layer P-ADL.

In some examples, a hard coating layer may be provided on at least one of the upper surface or the lower surface of the first base layer BS1, and a hard coating layer may be provided on at least one of the upper surface or the lower surface of the second base layer BS2.

A display device according to some embodiments includes a protective layer including a first base layer, a second base layer disposed on the first base layer, a base adhesive layer disposed between the first base layer and the second base layer, and a surface coating layer disposed on the second base layer, having a single-film structure, and including a hard coating material and an anti-fingerprint material. Accordingly, the display device according to some embodiments has improved impact resistance and folding characteristics. The display device according to some embodiments includes the protective layer including two base layers, thereby easily controlling the thickness thereof. In addition, the display device according to some embodiments includes the protective layer, which includes the surface coating layer having the hard coating material and the anti-fingerprint material, thereby having improved visibility.

A display device according to some embodiments includes a protective layer including two base layers, and an adhesive layer, thereby exhibiting excellent impact resistance.

In addition, a display device according to some embodiments includes a protective layer, which includes a surface coating layer having a hard coating material and an anti-fingerprint material, thereby having improved visibility.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

When one or more embodiments may be implemented differently, a specific process order may be performed differently from the described order. For example, (i) the disclosed operations of a process are merely examples, and may involve various additional operations not explicitly covered, and (ii) the temporal order of the operations may be varied.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The display device and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the device module may be formed on one integrated circuit (IC) chip or on separate IC chips. Further, the various components of the device module may be implemented on a flexible printed circuit film, a tape carrier package (TCP), a printed circuit board (PCB), or formed on a same substrate. Further, the various components of the device module may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In the above, description has been made with reference to some embodiments of the present disclosure, but those skilled in the art or those of ordinary skill in the relevant technical field may understand that various modifications and changes may be made to the present disclosure within the scope not departing from the spirit and the technology scope of the present disclosure, which is defined by the claims and equivalents thereof.

What is claimed is:

1. A display device comprising:

a display module;

a window on the display module; and a protective layer on the window, and comprising:

a first base layer, a second base layer on the first base layer, a base adhesive layer between the first base layer and the second base layer, and comprising a silicone-based adhesive, a surface coating layer on the second base layer, having a single-film structure, and comprising a hard coating material and an anti-fingerprint material;

an adhesive layer between the first base layer and the window; and a hard coating layer between the adhesive layer and the first base layer.

2. The display device of claim 1, wherein the base adhesive layer has a tensile modulus of about 0.1 GPa to about 4.5 GPa.

3. The display device of claim 1, wherein the base adhesive layer has a thickness of about 3 μm to about 4.5 μm.

4. The display device of claim 1, wherein an edge part of the base adhesive layer is more inward than each of an edge part of the first base layer and an edge part of the second base layer.

5. The display device of claim 4, wherein the edge part of the base adhesive layer is more inward than the edge part of the first base layer by a first width, more inward than the edge part of the second base layer by a second width, and wherein each of the first width and the second width is about 450 μm to about 600 μm.

6. The display device of claim 1, wherein, when viewed from a plan view, the base adhesive layer has a smaller area than each of the first base layer and the second base layer.

7. The display device of claim 1, wherein the first base layer and the second base layer each have a modulus of about 3.5 GPa to about 5.0 GPa.

8. The display device of claim 1, wherein each of the first base layer and the second base layer has a thickness of about 35 μm to about 50 μm.

9. The display device of claim 1, wherein the first base layer comprises polyethylene terephthalate.

10. The display device of claim 9, wherein the second base layer is composed of a material different from that of the first base layer.

11. The display device of claim 1, wherein the adhesive layer has a thickness of about 25 μm to about 70 μm.

12. The display device of claim 1, wherein the protective layer, the window, and the display module are folded and unfolded with respect to a folding axis.

13. The display device of claim 12, wherein the window comprises a thin-film glass.

14. The display device of claim 13, wherein the window has a thickness of about 80 μm or less.

15. The display device of claim 14, wherein the surface coating layer has a thickness of about 3 μm to about 10 μm.

16. The display device of claim 15, wherein the surface coating layer has a surface contact angle of about 110° to about 120°.

17. The display device of claim 1, wherein each of the first base layer and the second base layer is an elongated film with a controlled optical axis, and wherein each of a difference between tensile moduli of the first base layer and the second base layer on a first elongation axis and a difference between tensile moduli of the first base layer and the second base layer on a second elongation axis is 0 to about 1.1 GPa.

18. The display device of claim 1, wherein the surface coating layer has a Vickers hardness number of about 40 or more.

19. The display device of claim 1, wherein the surface coating layer comprises the anti-fingerprint material in an amount of 0 wt % to about 10 wt % with respect to a total weight of the surface coating layer.

* * * * *